United States Patent
Damodaran et al.

(10) Patent No.: US 7,487,421 B2
(45) Date of Patent: Feb. 3, 2009

(54) EMULATION CACHE ACCESS FOR TAG VIEW READS

(75) Inventors: Raguram Damodaran, Plano, TX (US); Ananthakrishnan Ramamurti, Irvine, CA (US)

(73) Assignee: Texas Instruments Incorporated, Dallas, TX (US)

( * ) Notice: Subject to any disclaimer, the term of this patent is extended or adjusted under 35 U.S.C. 154(b) by 358 days.

(21) Appl. No.: 11/422,740

(22) Filed: Jun. 7, 2006

(65) Prior Publication Data

US 2007/0033470 A1 Feb. 8, 2007

Related U.S. Application Data

(60) Provisional application No. 60/688,973, filed on Jun. 9, 2005.

(51) Int. Cl.
*G01R 31/28* (2006.01)
(52) U.S. Cl. .............. 714/733; 714/30; 714/42; 714/724; 714/718; 365/201
(58) Field of Classification Search ............ None
See application file for complete search history.

(56) References Cited

U.S. PATENT DOCUMENTS

| 5,640,509 | A | * | 6/1997 | Balmer et al. ............ 714/42 |
| 6,966,017 | B2 | * | 11/2005 | Evans .................. 714/718 |
| 7,017,094 | B2 | * | 3/2006 | Correale et al. .......... 714/733 |
| 2003/0084389 | A1 | * | 5/2003 | Kottapalli et al. ........ 714/733 |

* cited by examiner

*Primary Examiner*—John P Trimmings
(74) *Attorney, Agent, or Firm*—Robert D. Marshall, Jr.; W. James Brady; Frederick J. Telecky, Jr.

(57) ABSTRACT

A built-in self test unit reads tag bits of a predetermined cache entry and outputs these tag bits via an external interface. The built-in self test unit enters an emulation mode upon receipt of an emulation signal via the external interface when a first configuration register has a predetermined state. The built-in self test unit then reads tag bits upon each memory mapped read of a second configuration register. The read operation advances to next sequential tag bits upon each memory mapped read of the second configuration register. The tag bits include at least one valid bit and at least one dirty bit. The tag bits also include the most significant bits of the cached address.

5 Claims, 3 Drawing Sheets

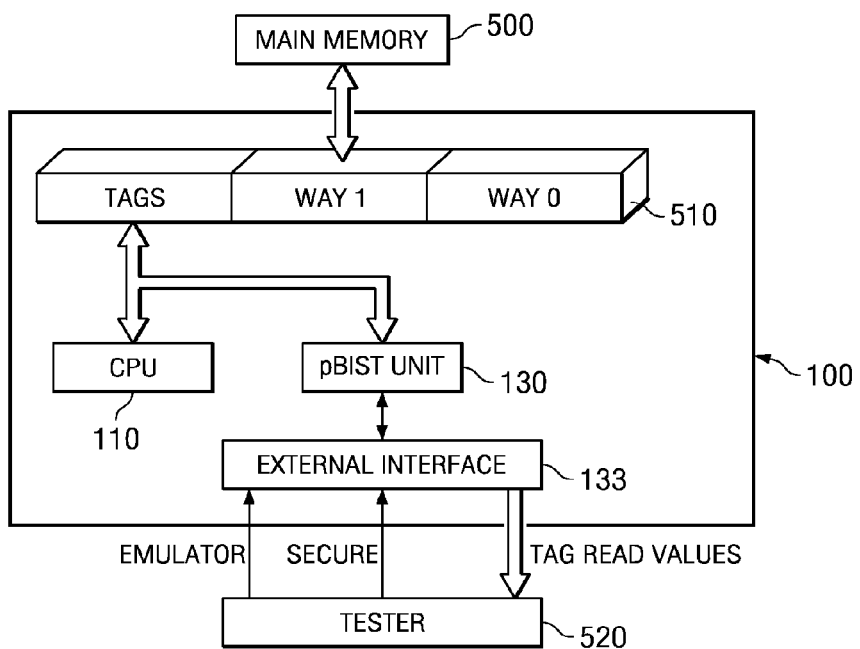

EMULATION CACHE ACCESS FOR TAG VIEW READS

CLAIM OF PRIORITY

This application claims priority under 35 U.S.C. 119(e)(1) to U.S. Provisional Application No. 60/688,973 filed Jun. 9, 2005.

TECHNICAL FIELD OF THE INVENTION

The technical field of this invention is debugging applications on data processors including cache.

BACKGROUND OF THE INVENTION

Testing fabricated integrated circuits to determine proper operation has always been a difficult problem. There are two major types of errors. A design defect means that the integrated circuit was manufactured to a design not proper for the intended purpose. Such a defect will effect every integrated circuit until the design is changed. The integrated circuit manufacturer must detect and correct such defects before shipping large number of parts to customers to avoid a costly recall. A manufacturing defect involves some fault in the manufacture of the integrated circuit that will effect less than all parts manufactured. Such defects are corrected by identification and correction of the manufacturing fault.

Most integrated circuit manufacturers test integrated circuits for proper function before shipment to customers. With the increase in integrated circuit complexity this testing is increasingly difficult. Many manufacturers rather than rely on increasingly expensive external testing devices test integrated circuits using a technique called built-in self test (BIST). BIST involves using circuits manufactured on the integrated circuit to test the integrated circuit. When triggered either automatically in circuit operation or by an external test device, the BIST circuits produce a set of test conditions run on the ordinary circuit hardware. Comparison of the state of the integrated circuit following test to an expected state indicates whether the integrated circuit passed the test. An example of such a test is writing to a read/write memory and recalling the data written. A match between the data written and the data read results in passing the test. BIST typically involves other more complex tests.

A subset of BIST is programmable built-in self test (pBIST) uses a general purpose test engine programmed by a set of instructions. This set of test instructions is typically stored on the integrated circuit in a read only memory (ROM) storing test instructions particularly developed for that integrated circuit. pBIST enables re-use of hardware and test instructions to cover a family of similar but not identical integrated circuits. pBIST typically does not have the ability to support go/no-go type of testing using an instruction ROM.

No known way to securely access tag views of memories. Without accessing the tags associated with the cache memories, debugging becomes difficult.

SUMMARY OF THE INVENTION

This invention is an integrated circuit with a built-in self test and a manner to read cache tags. The built-in self test unit reads tag bits of a predetermined cache entry and outputs these tag bits via an external interface. The built-in self test unit enters an emulation mode upon receipt of an emulation signal via the external interface when a first configuration register has a predetermined state. The built-in self test unit then reads tag bits upon each memory mapped read of a second configuration register. The read operation advances to next sequential tag bits upon each memory mapped read of the second configuration register.

The tag bits indicate cache state by at least one valid bit and at least one dirty bit. The tag bits also include the most significant bits of the cached address.

This tag bit read is thus implemented a way to securely access cache tag bits through emulation. The hardware is internally configured to access only one tag location at a time and return the read tag views to the CPU or tester. At present, there is no known way to read these tag bits in a secure manner.

BRIEF DESCRIPTION OF THE DRAWINGS

These and other aspects of this invention are illustrated in the drawings, in which:

FIG. 5 is an alternative block diagram view showing the operation of the pBIST unit in this invention; and FIG. 6 illustrates an example of the tag data read by this invention.

DETAILED DESCRIPTION OF PREFERRED EMBODIMENTS

Figure 1:
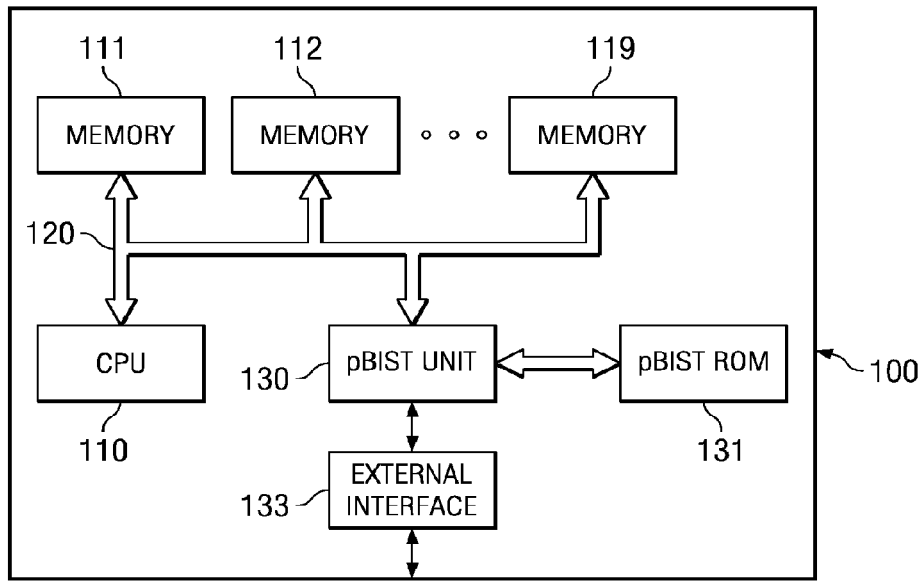
FIG. 1 is a block diagram of a typical integrated circuit including a programmable built-in self test unit (prior art)

FIG. 1 illustrates a typical integrated circuit 100 including programmable built-in self test. FIG. 1 illustrates integrated circuit 100 including central processing unit (CPU) 110 and memories 111, 112 . . . 119 coupled by bus 120. These circuits are merely representative of circuits embodied in an integrated circuit including pBIST.

The programmable built-in self test includes pBIST unit 130, pBIST ROM 131 and external interface 133. pBIST unit 130 controls the tests in much the same fashion as CPU 110 controls operation of integrated circuit 100. pBIST unit 130 is controlled by test instructions stored in pBIST ROM 131. pBIST unit 130 may couple to circuits outside integrated circuit 100 via external interface 133. FIG. 1 illustrates pBIST unit 130 coupled to CPU 110 and memories 111, 112 . . . 119 via bus 120. This connection is merely illustrative of the type of connection between pBIST unit 130 and other circuits of integrated circuit 100.

Figure 2:
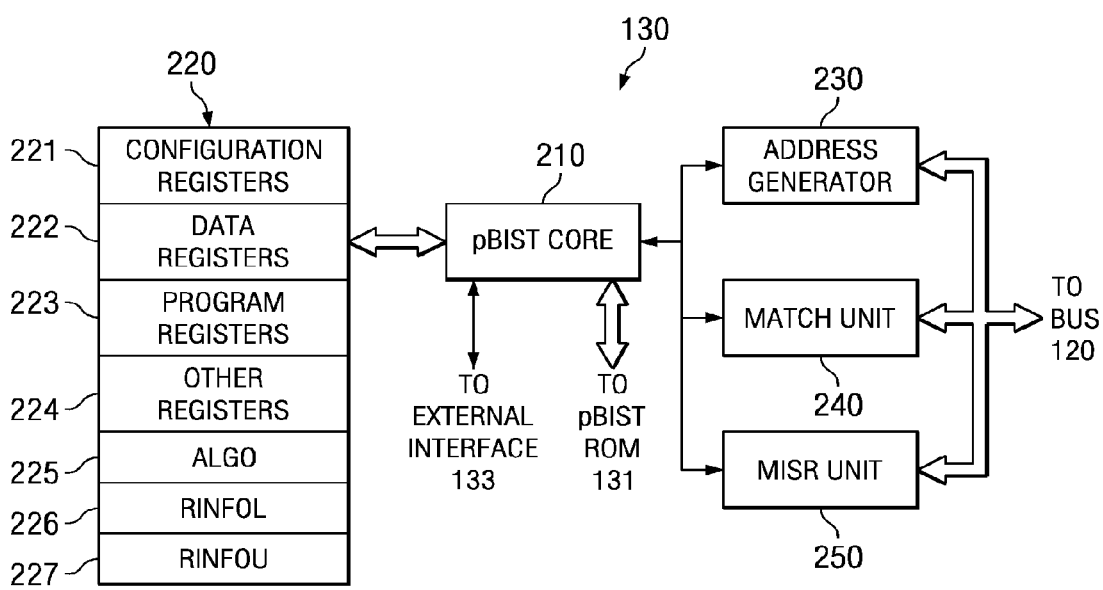
FIG. 2 is a block diagram of the programmable built-in self test unit of this invention.

FIG. 2 illustrates a more detailed view of pBIST unit 130. pBIST unit 130 includes pBIST core 210, registers 220, address generator 230, match unit 240 and MISR unit 250. pBIST core 210 is the center of pBIST unit 130. pBIST core 210 is coupled to registers 220, pBIST ROM 131, external interface 133, address generator 230, match unit 240 and MISR unit 250. Interaction of pBIST core 210 with these circuits will be further described below.

Registers 220 are preferably memory mapped within the address space of CPU 110. Thus CPU 110 can read from or write to any register within registers 220 by a memory operation to a corresponding address. Registers 220 include configuration registers 221. Configuration registers 221 control the configuration of pBIST unit 130 and the operational mode of pBIST unit 130. Data registers 222 store test data recalled from pBIST ROM 131 in a manner more fully described below. Program registers 223 store test program instructions recalled from pBIST ROM 131 in a manner more fully described below. Other registers 224 include miscellaneous registers not fully described. Registers 220 includes three registers described in detail below: ALGO register 225; RINFOL register 226; and RINFOU 227.

The ALGO register 225 is an algorithm mask register. Bit [0] of this register indicates whether the first algorithm stored in the ROM would be executed or not. Bit [1] indicates whether the second algorithm is executed and so on. A total of 32 algorithms can be stored in the ROM as is determined by the data width of ALGO register 225. For an algorithm to be executed, both the corresponding bit of the ALGO register and a valid bit in the previous algorithm header must be set. The details of this valid bit will be further described below.

The RAM group mask registers RINFOL register 226 and RINFOU register 227 are similar to ALGO register 225. RAM group mask registers RINFOL register 226 and RINFOU register 227 indicate whether a particular RAM group is executed or not. This capability is provided because not all algorithms can be run on all memories. For a particular RAM group to be executed, the corresponding bit in RINFOL register 226 or RINFOU register 227 and the valid bit in the previous RAM group header must both be set. RINFOL register 226 indicates the validity of RAM groups 0 to 31 and RINFOU register 227 indicates the validity of RAM groups 32 to 63. These RAM groups will be further described below.

Figure 3:
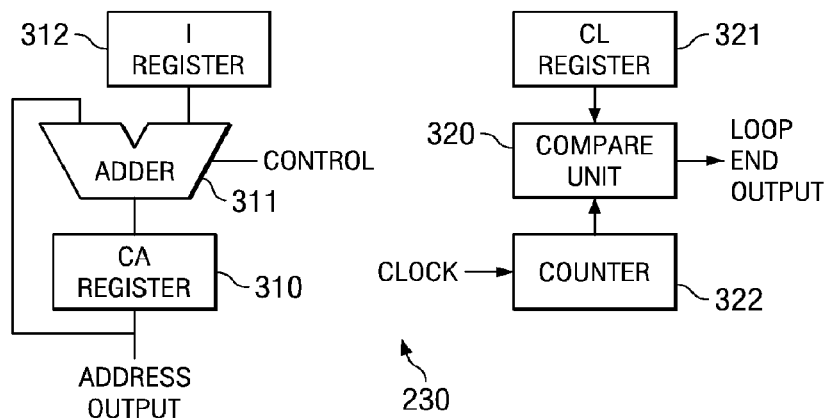
FIG. 3 is a block diagram of the address generation unit of the programmable built-in self test unit of FIG. 2.

Address generator 230 preferably includes two address generators used in accessing memory, such as memories 111, 112 . . . 119. FIG. 3 illustrates a block diagram of one of these address generators. Address generator 230 includes CA address register 310, adder 311, I increment register 312, compare unit 320, loop count register 321 and counter 322. In the preferred embodiment the initial values of address register CA 310, increment register 1312 and loop count register 321 are recalled from pBIST ROM 131. Adder 311 is controlled via a control input in one of three modes. In a non-increment mode, adder 311 returns an address output equal to the recycled value of CA register 310. The value of CA register 310 is thus unchanged. In an increment mode, adder 311 adds the values stored in CA register 310 and I increment register 312. The sum value is stored in CA address register 310 for the next iteration. The decrement mode is similar to the increment mode, except adder 311 subtracts the value of I increment register 312 from the value of CA address register 310. The difference value is stored in CA address register 310 for the next iteration. The initial value of CL loop count register 321 sets the number of iterations in the loop. Compare unit 320 compares the value of CL loop count register 321 with the value of counter 322. Upon starting a test counter 322 is reset to zero. The count of counter 322 advances by one each cycle of the clock input. Compare unit 320 generates a loop end output when these two values match.

Integrated circuits such as integrated circuit 100 illustrated in FIG. 1 often use cache memory. A cache memory stores a limited amount of data in a location close in time of access to CPU 110. The value of a cache memory is based on the principle of time and address locality. Once data from a particular memory address is used, it is likely that that data at that memory address or a nearby memory address will be accessed in the near future. A cache memory provides an advantage by enabling subsequent accesses to be serviced from the cache rather than from a more distant memory. The cache can be accessed by CPU 110 in a shorter period of time because it is physically closer to CPU 110 and is smaller than the memory cached.

A cache is filled from cache misses. When a memory access occurs, the system first checks to determine if the needed access can be serviced in the cache. If the data is in the cache, this is called a cache hit. If the data is not in the cache, this is called a cache miss. Upon a cache miss, the needed data is recalled from the more distant memory. It is typical to fetch from the more distant memory a block of data including more than the requested data. When received at the cache this block is stored in a memory array as a cache line. The memory address within the distant memory is stored together with the cache line in a tag array. The tag value is typically the most significant bits of the address. Location within the cache line serves as a proxy for the least significant address bits. The cache compares the address of subsequent accesses to memory with the current tag values. A match indicates the cache stores the accessed data. The lack of a match indicates the cache does not store the accessed data.

A cache memory cannot be as large as the address space. Otherwise access time to the cache can be no better than to the more distant memory. Thus in any cache system more than one address block will alias to a given cache line. To avoid having to replace a cache line merely because another access aliases to the same location, it is typical to employ two or more cache lines in the memory array corresponding to the same most significant address bits. Each such cache line is known as a cache way.

Whatever the size of the cache, the data processor will eventually fill it. Upon the next following cache miss, a cache entry must be cleared to enable the missed data from the distant memory to be stored. Caches typically employ a least recently used algorithm. Along with the corresponding memory address and an indication of whether the cache entry is dirty, the cache must store an indication of the last use of the cache entry. The cache entry to be replaced is the least recently used cache entry. This is based upon the assumption that the least recently used cache entry is the least likely to be needed again in the near future.

While cache use can greatly speed data processing, it often complicates application debugging. Because memory accesses are often serviced from the cache, it is often difficult to determine why an application under development is failing. It is often the case that being able to view the cache tag data would be helpful in application debugging.

This invention implements cache tag views through emulation in a secure manner. This capability can enable better debugging of the cache operation. The following document explains this cache access methodology briefly. Emulation cache access gives a chip-level emulation interface the ability to check the tags of a select group of memories. In this invention, the only way to gain access to cache tags is via pBIST unit 130.

Figure 4:
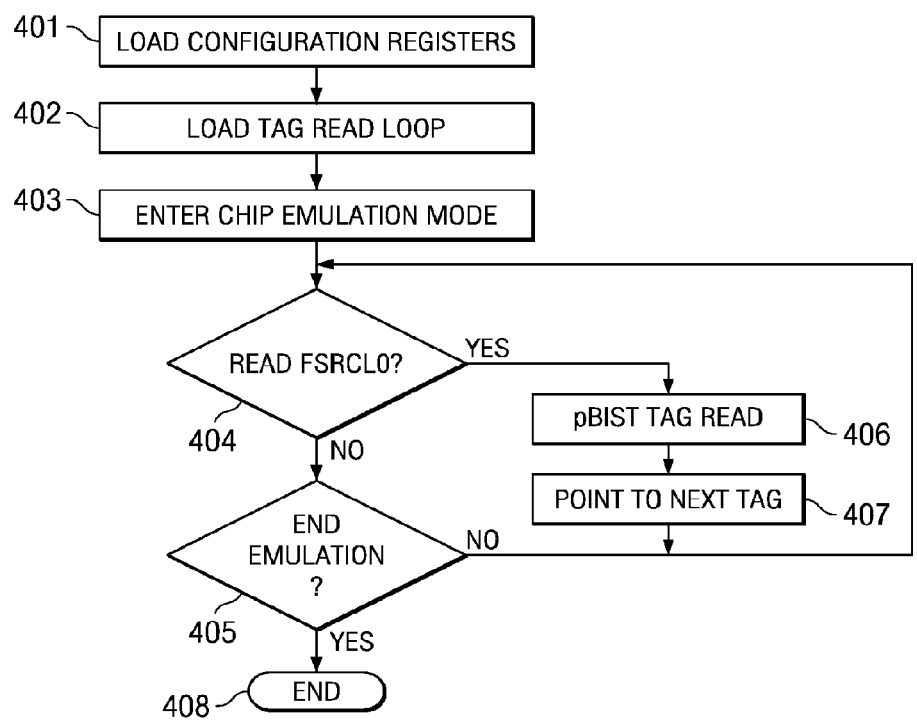
FIG. 4 is a flow chart of the operation of the tag view of this invention.

FIG. 4 is a flow chart of the operation of cache tag reads in accordance with this invention. The processes begins with the emulation interface logic accessing pBIST unit 130 through a CPU 110 interface and loading appropriate values into configuration registers 221 (step 401). These writes to configuration registers 221 set pBIST unit 130 to load information pertinent to the memory whose tag views will be read. For accesses via tester 520, a separate secure signal needs to be asserted to ensure that the cache access is secure. In step 402 the emulation interface logic loads a tag read algorithm into program registers 223. This algorithm includes read commands to fetch the desired tag views. A sample algorithm to read the tag views is given below:

```
LOOP: .M READ A0, D1:D0
    || .I DEC L0
    || .A ADD A0, I0
    || .B BNZ L0, LOOP
    .M HALT
```

Note the "||" symbol indicates operations performed simultaneously in parallel. Thus the tag read, the loop count increment, the address update and the end condition check are performed in parallel.

Step 403 enters the chip-level emulation mode. In this emulation mode, pBIST unit 130 is automatically set in single step mode. Thus pBIST unit 130 will only execute one instruction at a time.

Once the memory test begins, program execution in pBIST unit 130 stops at the first instruction and waits for a read of a specific internal register FSRDL0 (test step 404). If no such read is detected (No at test step 404), then test step 405 checks to determine the end of the emulation mode. If the system continues in emulation mode (No at test step 405), pBIST unit 130 returns to step 404 and waits in order to proceed.

Every time pBIST unit 130 senses a read of register FSRDL0 (Yes at test step 404), it fetches the appropriate tag at step 406 and advances an address pointer one step at step 407. Steps 406 and 407 correspond to the sample algorithm listed above. This fetched data is driven out on the read data bus to an external system (not shown in FIG. 4, see FIG. 5). Flow returns to test step 404 to for the register read. The algorithm advances to the next step only when there is another read access of the FSRDL0 register. This process is repeated until all the desired tags are read. At this point test 405 determines the end of emulation mode. The flow ends at end step 408. In accordance with this invention, emulation cache accesses are allowed only in secure supervisor mode. A separate secure signal would need to be asserted before any tag view reads could be issued.

FIG. 5 illustrates an alternative hardware view showing this invention. Integrated circuit 100 is connected to external main memory 500. Main memory 500 is cached on integrated circuit 100 in cache 510. Cache 510 includes a plurality of examples of tags and data storage in Way 1 and Way 0. CPU 110 and pBIST unit 130 are coupled to cache 510 via bus 120. Connection between pBIST unit 130 to external tester 520 is via external interface 133. Tester 520 supplies emulator and secure signals to pBIST unit 130 via external interface 133. pBIST unit 130 supplies tag read values to tester 520 via external interface 133.

FIG. 6 illustrates an example of tag read values supplied by pBIST unit 130 in accordance with this invention. As shown in FIG. 5, cache 510 is two-way set associative having ways Way 1 and Way 0. Bit [31] is valid bit V1 601 for Way 1. A "1" indicates that data stored in Way 1 is valid and may be used. A "0" indicates this data is invalid. Bit [30] is a similar valid bit V0 602 for Way 0. Bit [29] is dirty bit 603 for Way 1. A "1" indicates the data is dirty, that is, it has been changed since loading from main memory 500. A "0" indicates the data is clean and has not been changed. This dirty bit indicates the type of operation to perform on eviction of this cache line. If the cache line is dirty, then it must be written back to main memory 500 to preserve the program state. If the cache line is clean, it can be merely invalidated upon eviction and need not be written back to main memory 500. Bit [28] is a similar dirty bit 604 for Way 0. Bit [27] LRU bit 605 indicates which way was last used. A "0" indicates Way 0 was last used, a "1" indicates Way 1 was last used. When a cache line must be evicted to make room for other data, the least recently used way is cast out. Bits 26 to 21 606 indicate the memory protection status of the corresponding data. Bits 20 to 0 607 indicate the tag value, that is the upper address bits of the cache line. This data indicates which address location within main memory 500 stores the corresponding data. Following is a sample of one particular tag view that would be read through an emulation access.

Each memory can be identified by a unique 13-bit encoded identification number. Thus a specific 13-bit value could be used to indicate the actual memory access and separate value, such as illustrated in FIG. 6, could be used to indicate emulation tag view read.

What is claimed is:

1. An integrated circuit comprising:
   a plurality of operational circuits to be tested;
   a cache memory including a plurality of cache entries storing cached data and corresponding tag bits indicative of cache state and address cached;
   a test read only memory storing at least one test set consisting of a test algorithm and test data;
   an external interface; and
   a programmable built-in self test unit connected to said plurality of operational circuits to be tested, said test read only memory and said external interface, said programmable built-is self test unit operable to
      load from said test read only memory for each test set stored in said test read only memory one of said test algorithm and said test data,
      test at least one of said plurality of operational circuits to be tested according to said one of said test algorithm and said test data loaded, and
      read tag bits of a predetermined cache entry and output said tag bits via said external interface.

2. The integrated circuit of claim 1, wherein:
   said programmable built-in self test unit includes a plurality of memory mapped configuration registers;
   said programmable built-in self test unit is further operable to
      enter an emulation mode upon receipt of an emulation signal via said external interface when a first configuration register has a predetermined state,
      read said tag bits upon each memory mapped read of a second configuration register.

3. The integrated circuit of claim 2, wherein:
   said programmable built-in self test unit is further operable to
      read next sequential tag bits upon each memory mapped read of said second configuration register.

4. The integrated circuit of claim 1, wherein:
   said tag bits indicative of cache state include at least one valid bit indicative of whether corresponding data cached is valid or invalid.

5. The integrated circuit of claim 1, wherein:
   said tag bits indicative of cache state include at least one dirty bit indicative of whether corresponding data cached has or has not been written to since a last write to memory.

\* \* \* \* \*